United States Patent (10) Patent No.: US 11,676,833 B2
Priewasser (45) Date of Patent: Jun. 13, 2023

(54) PROTECTIVE SHEET FOR USE IN PROCESSING WAFER, HANDLING SYSTEM FOR WAFER, AND COMBINATION OF WAFER AND PROTECTIVE SHEETING

(71) Applicant: DISCO Corporation, Tokyo (JP)

(72) Inventor: Karl Heinz Priewasser, Munich (DE)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/613,570

(22) PCT Filed: May 18, 2017

(86) PCT No.: PCT/EP2017/061997
§ 371 (c)(1),
(2) Date: Nov. 14, 2019

(87) PCT Pub. No.: WO2018/210426
PCT Pub. Date: Nov. 22, 2018

(65) Prior Publication Data
US 2020/0373176 A1 Nov. 26, 2020

(51) Int. Cl.
H01L 21/67 (2006.01)
H01L 21/304 (2006.01)
H01L 21/683 (2006.01)
H01L 21/78 (2006.01)

(52) U.S. Cl.
CPC .... H01L 21/67132 (2013.01); H01L 21/3043 (2013.01); H01L 21/6836 (2013.01); H01L 21/78 (2013.01)

(58) Field of Classification Search
CPC ........... H01L 21/67132; H01L 21/3043; H01L 21/6836; H01L 21/78; H01L 21/6835; H01L 21/304; C09J 7/00; C09J 2203/326
See application file for complete search history.

(56) References Cited

U.S. PATENT DOCUMENTS

2006/0102080 A1 5/2006 Liu et al.
2013/0306215 A1 11/2013 Toida
(Continued)

FOREIGN PATENT DOCUMENTS

EP 1681713 A1 7/2006
JP 2009188010 A 8/2009
(Continued)

Primary Examiner — Dale E Page
Assistant Examiner — Quovaunda Jefferson
(74) Attorney, Agent, or Firm — Greer Burns & Crain Ltd.

(57) ABSTRACT

A protective sheeting for use in processing a semiconductor-sized wafer includes a protective film and a cushioning layer attached to a back surface of the protective film. At least in a central area of the protective sheeting, no adhesive is applied to a front surface and a back surface of the protective sheeting, the central area having an outer diameter which is equal to or larger than an outer diameter of the semiconductor-sized wafer. Further, a protective sheeting for use in processing a wafer has a protective film and a cushioning layer attached to a back surface of the protective film, wherein, on an entire front surface and an entire back surface of the protective sheeting, no adhesive is applied. A handling system for a semiconductor-sized wafer and to a combination of a wafer and the protective sheeting are also described.

16 Claims, 7 Drawing Sheets

(56) References Cited

U.S. PATENT DOCUMENTS

| | | | | |
|---|---|---|---|---|
| 2014/0203223 A1* | 7/2014 | Ikada | ............... | H01L 31/1884 |
| | | | | 252/514 |
| 2016/0218077 A1* | 7/2016 | Azuma | ............... | B32B 27/08 |
| 2016/0351510 A1* | 12/2016 | Mori | ............... | H01L 21/78 |
| 2017/0011949 A1 | 1/2017 | Saiki et al. | | |
| 2018/0247870 A1* | 8/2018 | Priewasser | ............... | H01L 21/78 |
| 2018/0315610 A1 | 11/2018 | Sekiya et al. | | |
| 2018/0337141 A1* | 11/2018 | Priewasser | ............... | H01L 21/6836 |

FOREIGN PATENT DOCUMENTS

| | | | |
|---|---|---|---|
| JP | 2011151070 A | 8/2011 | |
| JP | 2017050536 A | 3/2017 | |
| KR | 1020090093878 A | 9/2009 | |
| KR | 1020160103010 A | 8/2016 | |
| KR | 1020170092615 A | 8/2017 | |
| TW | 201402770 A | 1/2014 | |
| TW | 201715593 A | 5/2017 | |
| WO | 2017036512 A1 | 3/2017 | |
| WO | 2017077958 A1 | 5/2017 | |
| WO | 2018002035 A2 | 1/2018 | |

\* cited by examiner

PROTECTIVE SHEET FOR USE IN PROCESSING WAFER, HANDLING SYSTEM FOR WAFER, AND COMBINATION OF WAFER AND PROTECTIVE SHEETING

This is a National Phase Application filed under 35 U.S.C. § 371, of International Application No. PCT/EP2017/061997, filed May 18, 2017, the contents of which are incorporated by reference.

TECHNICAL FIELD

The present invention relates to a protective sheeting for use in processing a wafer, in particular, a semiconductor-sized wafer, to a handling system for a semiconductor-sized wafer, comprising a semiconductor-sized annular frame and the protective sheeting, and to a combination comprising a wafer, in particular, a semiconductor-sized wafer, having on one side a device area with a plurality of devices, and the protective sheeting.

TECHNICAL BACKGROUND

In a semiconductor device fabrication process, a wafer having a device area with a plurality of devices, commonly partitioned by a plurality of division lines, is divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed. Moreover, also other processing steps, such as polishing and/or etching, may be carried out on the back side of the wafer.

In order to protect the devices formed on the wafer, e.g., from breakage, deformation and/or contamination by debris, grinding water or cutting water, during processing of the wafer, a protective film or sheeting may be applied to the front side of the wafer prior to processing.

Such protection of the devices is particularly important if the device area has an uneven surface structure. For example, in known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies, e.g., when incorporating the dies in electronic equipment, such as mobile phones and personal computers.

In order to achieve a size reduction of such electronic equipment, the semiconductor devices have to be reduced in size. Hence, wafers having the devices formed thereon are ground in the grinding step referred to above to thicknesses in the µm range, e.g., in the range from 20 to 100 µm.

In known semiconductor device fabrication processes, problems may arise during processing, e.g., in the grinding step, if protrusions, such as bumps, are present in the device area. In particular, due to the presence of these protrusions, the risk of breakage of the wafer during processing is significantly increased. Further, if the wafer is ground to a small thickness, e.g., a thickness in the µm range, the protrusions of the device area on the front side of the wafer may cause a deformation of the wafer back side, thus compromising the quality of the resulting dies.

Therefore, the use of a protective film or sheeting is of particular importance when processing wafers with device areas having such uneven surface structures.

However, in particular, for the case of sensitive devices, such as MEMS, there is a problem in that the device structure on the wafer may be damaged by the adhesive force of an adhesive layer formed on the protective film or sheeting or may be contaminated by adhesive residues on the devices, when the film or sheeting is peeled off from the wafer.

Hence, there remains a need for a protective sheeting which enables reliable and efficient processing of a wafer and allows for any risk of contamination and damage to the wafer to be minimised.

SUMMARY OF THE INVENTION

Accordingly, it is an object of the present invention to provide a protective sheeting which enables reliable and efficient processing of a wafer and allows for any risk of contamination and damage to the wafer to be minimised. Further, the invention aims to provide a handling system comprising a semiconductor-sized annular frame and the protective sheeting, and to provide a combination comprising a wafer, in particular, a semiconductor-sized wafer, and the protective sheeting.

These goals are achieved by a protective sheeting with the technical features of claim 1, by a protective sheeting with the technical features of claim 6, by a handling system with the technical features of claim 11, by a combination with the technical features of claim 12, and by a combination with the technical features of claim 13. Preferred embodiments of the invention follow from the dependent claims.

The invention provides, according to a first aspect, a protective sheeting for use in processing a semiconductor-sized wafer. The protective sheeting comprises a protective film and a cushioning layer attached to a back surface of the protective film. At least in a central area of the protective sheeting, no adhesive is applied to a front surface and a back surface of the protective sheeting. The central area has a diameter, i.e., an outer diameter, which is equal to or larger than an outer diameter of the semiconductor-sized wafer.

Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 1 inch, 2 inch, 3 inch, 4 inch, 5 inch, 6 inch, 8 inch, 12 inch or 18 inch wafer.

The front surface of the protective sheeting is constituted by a front surface of the protective film opposite to the back surface thereof.

The back surface of the protective sheeting may be constituted by a back surface of the cushioning layer.

The protective sheeting is configured to be used in processing a semiconductor-sized wafer, such as a semiconductor wafer, having on one side, i.e., the front side, a device area with a plurality of devices.

When the protective sheeting is used in processing the semiconductor-sized wafer, the sheeting is applied to the one side of the wafer, i.e., to the wafer front side, so that the front surface of the sheeting, i.e., the front surface of the protective film, comes into contact with the wafer front side, and the sheeting, in particular, the protective film thereof, covers the devices formed in the device area. Specifically, the wafer is in contact with the central area of the protective sheeting, in which no adhesive is applied to the front surface and the back surface of the sheeting.

Since the central area of the sheeting has an outer diameter which is equal to or larger than the outer diameter of the semiconductor-sized wafer, the wafer can be arranged fully within this central area. Hence, the front surface of the protective film of the sheeting is in direct contact with the front side of the wafer. Thus, no material, in particular, no adhesive, is present between the front surface of the protective film and the wafer front side.

Therefore, any possible contamination of or damage to the devices formed in the device area, e.g., due to an adhesive force of an adhesive layer or adhesive residues on the devices, can be eliminated.

The protective sheeting of the present invention thus enables reliable and efficient processing of a wafer and allows for any risk of contamination and damage to the wafer, in particular, to the devices formed in the device area, to be minimised.

The protective sheeting can be prepared in advance, stored for later use and used for wafer processing when required. The protective sheeting may thus be manufactured in large quantities, rendering the production thereof particularly efficient in terms of both time and cost.

The diameter, i.e., the outer diameter, of the central area of the protective sheeting may be 3 cm or more, 6 cm or more, 8 cm or more, 11 cm or more, 13 cm or more, 16 cm or more, 21 cm or more, 31 cm or more, or 46 cm or more. The diameter of the central area of the protective sheeting may be 100 cm or less, 90 cm or less, 80 cm or less, 70 cm or less, 60 cm or less, 50 cm or less, 40 cm or less, 30 cm or less, 20 cm or less, or 10 cm or less.

Particularly preferably, the diameter of the central area of the protective sheeting is in the range of 3 to 50 cm, even more preferably 8 to 50 cm.

The protective film of the protective sheeting may be configured so that it can be attached to the front side of the wafer by heating the protective film. In this way, the protective sheeting can be attached to the wafer by heating the protective film or the entire protective sheeting.

In particular, during and/or after applying the protective sheeting to the front side of the wafer, the protective film or sheeting may be heated, so that the protective film, and thus the entire protective sheeting, is attached to the front side of the wafer. An attachment force between protective film and wafer, holding the protective sheeting in its position on the wafer, is thus generated through the heating process. Hence, no additional adhesive material is necessary for reliably attaching the protective sheeting to the front side of the wafer.

In particular, by heating the protective film or sheeting, a form fit, such as a positive fit, and/or a material bond, such as an adhesive bond, may be formed between the protective film and the wafer. The terms "material bond" and "adhesive bond" define an attachment or connection between protective film and wafer due to atomic and/or molecular forces acting between these two components.

The term "adhesive bond" relates to the presence of these atomic and/or molecular forces, which act so as to attach or adhere the protective sheeting to the wafer, and does not imply the presence of an additional adhesive between protective sheeting and wafer. Rather, the front surface of the protective sheeting is in direct contact with the front side of the wafer, as has been detailed above.

The protective film or sheeting may be allowed to cool down after the heating process. In particular, the protective film or sheeting may be allowed to cool down to its initial temperature, i.e., to the temperature thereof prior to the heating process. The protective film or sheeting may be allowed to cool down, e.g., to its initial temperature, before processing the wafer, in particular, before processing the side of the wafer being opposite to the one side, i.e., the wafer back side.

As has been detailed above, an attachment force between protective film and wafer can be generated through the heating process. The attachment of the protective film to the wafer may be caused in the heating process itself and/or in a subsequent process of allowing the protective film or sheeting to cool down.

The protective film may be configured so that it is softened and/or rendered more pliable, flexible and/or stretchable by heating, e.g., by the heating process described above. In this way, by heating the protective film, it can be made to conform to the wafer surface on the front side of the wafer, for example, absorbing the wafer topography. Upon cooling down, e.g., to its initial temperature, the protective film may reharden, e.g., so as to create a form fit and/or a material bond to the wafer.

The protective film may be configured so that it is softened and/or rendered more pliable, flexible and/or stretchable by heating to a temperature in the range of 60° C. to 150° C., preferably 70° C. to 140° C., more preferably 80° C. to 130° C. and even more preferably 90° C. to 120° C. Particularly preferably, the protective film is configured so that it is softened and/or rendered more pliable, flexible and/or stretchable by heating to a temperature of approximately 100° C.

The protective film may be heat resistant up to a temperature of 180° C. or more, preferably up to a temperature of 220° C. or more, and more preferably up to a temperature of 250° C. or more.

The cushioning layer may be heat resistant up to a temperature of 180° C. or more, preferably up to a temperature of 220° C. or more, and more preferably up to a temperature of 250° C. or more.

The protective sheeting may be heat resistant up to a temperature of 180° C. or more, preferably up to a temperature of 220° C. or more, and more preferably up to a temperature of 250° C. or more.

When the protective sheeting is used in processing the semiconductor-sized wafer, the protective film or the entire protective sheeting may be heated over a duration in the range of 1 min to 10 min, preferably 1 min to 8 min, more preferably 1 min to 6 min, even more preferably 1 min to 4 min and yet more preferably 1 min to 3 min, during and/or after applying the protective sheeting to the front side of the wafer, in order to attach the protective sheeting to the front side of the wafer.

The protective film or sheeting may be directly and/or indirectly heated.

The protective film or sheeting may be heated by directly applying heat thereto, e.g., using a heat application means, such as a heated roller, a heated stamp or the like, or a heat radiation means. The protective sheeting and the wafer may be placed in a receptacle or chamber, such as a vacuum chamber, and an inner volume of the receptacle or chamber may be heated, so as to heat the protective sheeting. The receptacle or chamber may be provided with a heat radiation means.

The protective film or sheeting may be indirectly heated, e.g., by heating the wafer before and/or during and/or after applying the protective sheeting to the front side of the wafer. For example, the wafer may be heated by placing the wafer on a support or carrier, such as a chuck table, and heating the support or carrier.

For example, the support or carrier, such as a chuck table, may be heated to a temperature in the range of 60° C. to 150° C., preferably 70° C. to 140° C., more preferably 80° C. to 130° C. and even more preferably 90° C. to 120° C. Particularly preferably, the support or carrier may be heated to a temperature of approximately 100° C.

These approaches may also be combined, for example, by using a heat application means, such as a heated roller or the like, or a heat radiation means for directly heating the protective film or sheeting, and also indirectly heating the protective film or sheeting through the wafer.

It is preferable that the protective film is pliable, elastic, flexible, stretchable, soft and/or compressible when in its heated state. In this way, it can be particularly reliably ensured that the protective film conforms to the wafer surface on the one side of the wafer, for example, absorbing the wafer topography. This is especially advantageous if the device area is formed with protrusions protruding from a plane surface of the wafer, as will be further detailed below.

Preferably, the protective film is configured so that it hardens or stiffens upon cooling down, at least to some degree, so as to become more rigid and/or robust in the cooled down state. In this way, particularly reliable protection of the devices during subsequent processing of the wafer, such as grinding and/or polishing, can be ensured.

The protective sheeting may be configured so as to be removable from the wafer after processing the back side thereof. Before and/or during removal of the protective sheeting from the wafer, the protective film or sheeting may be heated. In this way, the removal process can be facilitated.

The device area of the semiconductor-sized wafer to be processed using the protective sheeting of the invention may further have a plurality of division lines, partitioning the plurality of devices.

The wafer may further have, on the front side thereof, a peripheral marginal area having no devices and being formed around the device area.

The semiconductor-sized wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the semiconductor-sized wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The semiconductor-sized wafer may be made of a single material or of a combination of different materials, e.g., two or more of the above-identified materials. For example, the wafer may be a Si and glass bonded wafer, in which a wafer element made of Si is bonded to a wafer element made of glass.

The semiconductor-sized wafer has a substantially circular or circular shape. Herein, the term "substantially circular" defines a shape whose peripheral or circumferential form may deviate from a perfect circle, e.g., due to the provision of one or more flat or straight portions, notches and/or grooves.

The outer circumference of the semiconductor-sized wafer may have one or more flat or straight portions. The outer circumference of the wafer may have a notch or groove, for example, for indicating the crystal orientation of the wafer.

The protective sheeting may have any type of shape. In a top view thereon, the protective sheeting may have, for example, a circular shape, an oval shape, an elliptical shape or a polygonal shape, such as a rectangular shape or a square shape.

The protective sheeting may have substantially the same shape or the same shape as the wafer. The protective sheeting may have substantially the same shape or the same shape as the device area of the wafer.

In some embodiments, the protective sheeting may have a substantially circular or circular shape. The protective film and/or the cushioning layer may have a substantially circular or circular shape. The central area of the protective sheeting may have a substantially circular or circular shape.

The device area of the semiconductor-sized wafer may be formed with a plurality of protrusions or projections protruding from a plane surface of the wafer. The protective sheeting may be configured for embedding therein the protrusions or projections protruding from the plane surface of the wafer.

The protrusions or projections, such as bumps, may protrude, extend or project from a plane surface of the wafer which is a substantially flat surface. The protrusions or projections may define a surface structure or topography of the one side of the wafer, i.e., the front side thereof, rendering this one side uneven.

These protrusions or projections may be used, for example, for establishing an electrical contact with the devices in individual chips or dies after the wafer has been divided, e.g., when incorporating the chips or dies in electronic equipment, such as mobile phones and personal computers.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 500 µm, preferably 30 to 400 µm, more preferably 40 to 250 µm, even more preferably 50 to 200 µm and yet even more preferably 70 to 150 µm. Particularly preferably, the protrusions have a height in the thickness direction of the wafer in the range of 100 to 250 µm.

All the protrusions may have substantially the same shape and/or size. Alternatively, at least some of the protrusions may differ from each other in shape and/or size.

The protective sheeting of the invention may be configured for embedding therein the protrusions or projections protruding from the plane surface of the wafer. Hence, any negative influence of the surface unevenness arising from the presence of the protrusions in the device area on subsequent wafer processing steps can be reduced or even eliminated.

In particular, by embedding the protrusions in the protective sheeting, the protrusions can be protected from any damage during wafer processing, for example, in subsequent grinding and/or cutting steps.

Further, if the wafer is ground to a small thickness, e.g., a thickness in the µm range, the protrusions of the device area on the front side of the wafer may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting chips or dies.

The protective sheeting acts as a cushion or buffer between the wafer front side and, for example, a support or carrier on which the wafer front side rests during processing, e.g., grinding and/or polishing, the wafer back side, thus contributing to achieving a uniform and homogenous distribution of pressure during processing. Hence, a pattern transfer or breakage of the wafer during processing the back side thereof can be prevented.

When the protective sheeting is used in processing the semiconductor-sized wafer, during and/or after applying the protective sheeting to the front side of the wafer, pressure may be applied to the back surface of the protective sheeting opposite to the front surface thereof. In this way, the front surface of the protective sheeting, i.e., the front surface of the protective film, is pressed against the front side of the wafer. Thus, it can be particularly efficiently ensured that the protective sheeting is reliably attached to the wafer.

The pressure may be applied to the back surface of the protective sheeting before and/or during and/or after heating the protective film or sheeting. The pressure may be applied to the back surface of the protective sheeting before processing the back side of the wafer.

The pressure may be applied to the back surface of the protective sheeting by a pressure application means, such as a roller, a stamp, a membrane or the like.

Particularly preferably, a combined heat and pressure application means, such as a heated roller or a heated stamp, may be used. In this case, pressure can be applied to the back surface of the protective sheeting while, at the same time, heating the protective sheeting, thereby heating the protective film.

The pressure may be applied to the back surface of the protective sheeting in a vacuum chamber, as will be further detailed below.

The protective sheeting may be applied and/or attached to the front side of the wafer in a reduced pressure atmosphere, in particular, under a vacuum. In this way, it can be reliably ensured that no voids and/or air bubbles are present between the protective film and the wafer. Hence, any stress or strain on the wafer during processing the back side thereof, e.g., due to such air bubbles expanding in the heating process, is avoided.

For example, the step or steps of applying and/or attaching the protective sheeting to the front side of the wafer may be carried out in a vacuum chamber. In particular, the protective sheeting may be applied and/or attached to the front side of the wafer by using a vacuum laminator. In such a vacuum laminator, the wafer is placed on a chuck table in a vacuum chamber in a state in which the wafer back side is in contact with an upper surface of the chuck table and the wafer front side is oriented upward. The chuck table may be, for example, a heated chuck table.

The protective sheeting to be applied to the wafer front side is held at its peripheral portion by an annular frame and placed above the wafer front side in the vacuum chamber. An upper part of the vacuum chamber which is situated above the chuck table and the annular frame is provided with an air inlet port closed by an expandable rubber membrane.

After the wafer and the protective sheeting have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective sheeting against the wafer front side, sealing the peripheral wafer portion with the protective sheeting and pressing the sheeting against the device area on the wafer front side. Hence, the protective sheeting can be applied closely to the wafer front side, so that the protective film follows the contours of the device area, e.g., the contours of protrusions or projections present therein.

The protective film or sheeting may be heated during and/or after application thereof to the front side of the wafer, e.g., by heating the chuck table.

Subsequently, the vacuum in the vacuum chamber is released and the protective sheeting is held in its position on the wafer front side by the attachment force generated through the heating process and the positive pressure in the vacuum chamber.

Alternatively, the rubber membrane can be replaced by a soft stamp or a soft roller, e.g., a heated soft stamp or a heated soft roller.

Processing the side of the wafer being opposite to the one side, i.e., the wafer back side, may comprise or consist of grinding and/or polishing and/or etching the side of the wafer being opposite to the one side.

In particular, processing the side of the wafer being opposite to the one side may comprise or consist of grinding the side of the wafer being opposite to the one side for adjusting the wafer thickness. In this case, the protective sheeting of the invention can be employed in a particularly advantageous manner.

Specifically, in the grinding process, considerable pressure is applied to the back side of the wafer. This pressure may cause damage to the wafer, such as breakage and/or deformation thereof, in particular, if the wafer is ground to a small thickness, e.g., a thickness in the µm range. For example, a pattern of protrusions or projections formed on the wafer front side may be transferred to the wafer back side, as has been detailed above.

The protective sheeting of the present invention acts as a cushion or buffer between the wafer front side and, for example, a support or carrier, such as a chuck table, on which the wafer front side rests during grinding the wafer back side. Hence, a more uniform and homogenous distribution of pressure during grinding can be achieved, reducing or even eliminating the risk of a pattern transfer or breakage of the wafer during grinding.

Processing the semiconductor-sized wafer may further comprise cutting the wafer, e.g., along division lines partitioning the plurality of devices.

The wafer may be cut from the front side or the back side thereof. The cutting of the wafer may form part of or constitute the processing of the side of the wafer being opposite to the one side.

The cutting may be performed by mechanical cutting, e.g., by blade dicing or sawing, and/or by laser cutting and/or by plasma cutting. The wafer may be cut in a single mechanical cutting step, a single laser cutting step or a single plasma cutting step. Alternatively, the wafer may be cut by a sequence of mechanical cutting and/or laser cutting and/or plasma cutting steps.

Laser cutting may be performed, for example, by ablation laser cutting and/or by stealth laser cutting, i.e., by forming modified areas within the wafer by the application of a laser beam, and/or by forming a plurality of hole regions in the wafer by the application of a laser beam. Each of these hole regions may be composed of a modified region and a space in the modified region open to a surface of the wafer.

The cutting of the wafer may be performed in a state in which the protective sheeting is attached to the wafer. In this way, it can be ensured that the pressure applied during the cutting step is more uniformly and homogenously distributed throughout the wafer during cutting, thus reducing or even minimising any risk of damage to the wafer, e.g., cracking of the sidewalls of the resulting chips or dies, in the cutting step. In this case, it is particularly preferred that the wafer be cut from the back side thereof.

The protective sheeting may have an outer diameter which is larger than an outer diameter of the semiconductor-sized wafer. In this way, processing, handling and/or transport of the wafer can be facilitated. In particular, an outer peripheral portion of the protective sheeting can be attached to an annular frame, as will be detailed below.

The protective sheeting may have an outer diameter which is substantially the same as the outer diameter of the semiconductor-sized wafer.

The protective film and/or the cushioning layer may have an outer diameter which is larger than an outer diameter of the semiconductor-sized wafer.

The protective film and/or the cushioning layer may have an outer diameter which is substantially the same as the outer diameter of the semiconductor-sized wafer.

When the protective sheeting is used in processing the semiconductor-sized wafer, the protective sheeting may be cut. The protective sheeting may be cut so that it has an outer diameter which is larger than the outer diameter of the wafer or substantially the same as the outer diameter of the wafer.

The step of cutting the protective sheeting may be performed before or after applying the protective sheeting to the wafer.

The step of cutting the protective sheeting may be performed before or after attaching the protective sheeting to the wafer.

The protective sheeting may be configured so that, on the entire front surface and/or on the entire back surface of the protective sheeting, no adhesive is applied. The entire front surface and/or the entire back surface of the protective sheeting may be devoid of an adhesive.

In this way, a contamination of the wafer, in particular, the devices formed in the device area, during processing by adhesive residues can be particularly reliably avoided.

A substantially annular or annular adhesive layer may be applied to an outer peripheral portion of a front surface of the protective film opposite to the back surface thereof. The front surface of the protective film constitutes the front surface of the protective sheeting, as has been detailed above.

Herein, the term "substantially annular" defines that the shape of the adhesive layer may deviate from a perfect annulus, e.g., due to the presence of one or more flat or straight portions, notches and/or grooves.

The substantially annular or annular adhesive layer may be a continuous adhesive layer. Alternatively, the substantially annular or annular adhesive layer may be a discontinuous adhesive layer. In particular, in the substantially annular or annular adhesive layer, the adhesive may be provided in a discontinuous form, such as a dotted form, a stripe form, e.g., with straight and/or curved stripes, or the like.

The substantially annular or annular adhesive layer may be heat resistant up to a temperature of 180° C. or more, preferably up to a temperature of 220° C. or more, and more preferably up to a temperature of 250° C. or more.

An inner diameter of the substantially annular or annular adhesive layer may be substantially equal to or larger than an inner diameter of a semiconductor-sized annular frame for holding the semiconductor-sized wafer.

Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 1 inch, 2 inch, 3 inch, 4 inch, 5 inch, 6 inch, 8 inch, 12 inch or 18 inch.

The inner diameter of the substantially annular or annular adhesive layer is larger than the outer diameter of the semiconductor-sized wafer.

An outer diameter of the substantially annular or annular adhesive layer is larger than the inner diameter of the semiconductor-sized annular frame.

By means of the substantially annular or annular adhesive layer, the outer peripheral portion of the protective film may be attached to the annular frame so that the protective sheeting closes a central opening of the annular frame, i.e., the area inside the inner diameter of the annular frame. In this way, the wafer, which is attached to the protective sheeting, in particular, to the central area thereof, is held by the annular frame through the protective sheeting. Thus, a wafer unit, comprising the wafer, the protective sheeting and the annular frame, is formed, facilitating processing, handling and/or transport of the wafer.

The substantially annular or annular adhesive layer may be arranged between the protective sheeting and the annular frame.

The step of attaching the outer peripheral portion of the protective film to the annular frame may be performed before or after applying the protective sheeting to the wafer.

The step of attaching the outer peripheral portion of the protective film to the annular frame may be performed before or after attaching the protective sheeting to the wafer.

The step of attaching the outer peripheral portion of the protective film to the annular frame may be performed before or after processing the back side of the wafer.

The device area of the wafer may be formed with a plurality of protrusions or projections, such as bumps, protruding from a plane surface of the wafer, as has been detailed above.

The protective sheeting of the invention may be configured so that the protrusions or projections protruding from the plane surface of the wafer are embedded in the sheeting, i.e., in the protective film or in the protective film and the cushioning layer.

By embedding the protrusions or projections in the protective sheeting, the protrusions or projections are particularly reliably protected from any damage during wafer processing, for example, in subsequent grinding and/or cutting steps.

The protective film of the sheeting is configured to cover the devices formed in the device area of the wafer, therefore protecting the devices from damage and contamination. Moreover, the protective film facilitates removal of the protective sheeting from the wafer after processing. In particular, since the front surface of the protective sheeting is in direct contact with the front side of the wafer, i.e., no adhesive is present between the front surface of the protective sheeting and the wafer front side, the protective sheeting can be removed from the wafer in an especially simple and efficient manner.

The cushioning layer may be formed of any type of material which allows for the protrusions or projections protruding from the plane surface of the wafer to be embedded therein. For example, the cushioning layer may be formed of a resin, an adhesive, a gel or the like. However, if the back surface of the protective sheeting is constituted by the back surface of the cushioning layer, no additional adhesive, i.e., no adhesive in addition to the material of the cushioning layer, is applied to the back surface of the cushioning layer, at least in the central area of the protective sheeting.

The cushioning layer may have a thickness in the range of 20 to 300 μm, preferably 50 to 250 μm and more preferably 80 to 200 μm.

The configuration of the protective sheeting of the invention, comprising the protective film and the cushioning layer attached to the back surface thereof, is particularly advantageous for wafers having a relatively high degree of surface roughness or unevenness on the front side thereof, e.g., due to the presence of protrusions or projections, such as bumps. In this case, the protrusions or projections may not be fully embedded in the protective film of the protective sheeting, so that at least a certain degree of surface unevenness is present on the back surface of the protective film. This surface unevenness is absorbed by the cushioning layer, further embedding the protrusions or projections. Thus, the protrusions or projections can be protected in a particularly reliable manner. Moreover, the distribution of stress or strain over the wafer during processing thereof can be further improved, as will be detailed below.

The front surface of the cushioning layer is in contact with the back surface of the protective film.

When the protective sheeting is used in processing the semiconductor-sized wafer, the back surface of the cushioning layer opposite to the front surface thereof may be made substantially parallel to the side of the wafer being opposite to the one side, i.e., to the wafer back side.

In this case, when processing, e.g., grinding, polishing and/or cutting, the back side of the wafer, a suitable counter pressure can be applied to the back surface of the cushioning layer, e.g., by placing this back surface on a support or carrier, such as a chuck table.

In this case, since the plane back surface of the cushioning layer is substantially parallel to the back side of the wafer, the pressure applied to the wafer during processing, such as grinding, e.g., by a grinding wheel of a grinding apparatus, is evenly and homogenously distributed over the wafer, thus minimising any risk of a pattern transfer, i.e., a transfer of a pattern defined by protrusions or projections in the device area to the processed, e.g., ground wafer back side, and breakage of the wafer. Further, the substantially parallel alignment of the flat, even back surface of the cushioning layer and the back side of the wafer allows for the processing step to be carried out with a high degree of precision thus, for example, achieving a particularly uniform and homogenous wafer thickness after grinding.

Also, the protective film acts as a further cushion or buffer between the wafer front side and the cushioning layer, thus further contributing to the uniform and homogeneous distribution of pressure during processing, such as grinding. Hence, a pattern transfer or breakage of the wafer during processing can be particularly reliably prevented.

The back surface of the cushioning layer may be made substantially parallel to the back side of the wafer by applying pressure to the back surface of the cushioning layer. The pressure may be applied directly to the back surface of the cushioning layer, i.e., so that no additional element or component is present between a pressing means for applying the pressure and the back surface of the cushioning layer.

For example, the wafer and the cushioning layer may be pressed together, with the protective film or sheet arranged inbetween, by applying a parallel pressing force to the wafer back side and the back surface of the cushioning layer, for example, in a mounting chamber, such as a vacuum chamber. The pressure may be applied, e.g., by means of two parallel pressing plates. The pressing plates may be heated pressing plates, allowing for the protective film to be heated during the pressing process.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the protective sheeting of the invention are ResiFlat by the DISCO Corporation and TEMPLOC by DENKA.

When the protective sheeting is used in processing the semiconductor-sized wafer, the external stimulus may be applied to the cushioning layer so as to cure the cushioning layer, after applying the protective sheeting to the front side of the wafer. The external stimulus may be applied to the cushioning layer after attaching the protective sheeting to the front side of the wafer.

The external stimulus may be applied to the cushioning layer before processing, e.g., grinding, the wafer back side. In this way, the protection of the wafer during processing and the processing accuracy can be further improved.

The protective film of the protective sheeting facilitates removal of the curable or cured cushioning layer attached thereto from the wafer. In particular, due to the presence of the protective film in the sheeting, the cushioning layer can be removed from the wafer in a reliable and simple manner, avoiding any residues, such as resin, adhesive or gel residues, in the device area, thus preventing contamination of the devices, and minimising the risk of damaging the protrusions or projections in the removal process.

The cured cushioning layer can be removed after curing in a particularly reliable and efficient manner if the curable cushioning layer exhibits a degree of compressibility, elasticity and/or flexibility, i.e., is compressible, elastic and/or flexible, for example, rubber-like, after curing.

If the cushioning layer is configured so as to reach a rigid, hard state upon curing, removal of the cushioning layer from the wafer may be facilitated by applying an external stimulus to the cured cushioning layer, softening or removing the cushioning layer at least to some extent. For example, some cushioning layers, e.g., formed of the UV curable resin TEMPLOC by DENKA, may be treated by applying hot water thereto after curing, in order to soften the cured cushioning layer and allow for a particularly easy removal of the cushioning layer from the wafer.

The protective sheeting, comprising the protective film and the cushioning layer, may be removed from the wafer after processing, such as grinding. For example, the protective sheeting may be removed from the wafer after grinding but before cutting or after grinding and cutting. In this way, individual chips or dies obtained in the cutting process can be separated and picked up in a simple and reliable manner.

The cushioning layer and the protective film of the protective sheeting may be removed individually, i.e., one after the other. For example, the cushioning layer may be removed first, followed by the removal of the protective film.

Cutting of the wafer may be performed before removing the protective sheeting from the wafer. In this case, the wafer is safely protected by the protective sheeting in the cutting process. Hence, any damage to the wafer during cutting can be particularly reliably avoided.

Alternatively, cutting of the wafer may be performed after removing the protective sheeting from the wafer. This approach allows for the individual chips or dies to be separated and picked up immediately after the cutting step. In this case, it is particularly preferable to perform the cutting step from the front side of the wafer.

The protective film of the protective sheeting may be made of a plastic material, such as a polymer. Particularly preferably, the protective film is made of a polyolefin. For example, the protective film may be made of polyethylene (PE) or polypropylene (PP).

Polyolefin films have material properties which are particularly advantageous for use as the protective film of the protective sheeting of the present invention. In particular, such films are pliable, stretchable and soft when in a heated state, e.g., when heated to a temperature in the range of 60° C. to 150° C. Thus, it can be particularly reliably ensured that the protective film conforms to the wafer surface on the front side of the wafer, for example, absorbing the wafer topography. This is particularly beneficial if the device area is formed with protrusions or projections protruding from a plane surface of the wafer.

Further, polyolefin films harden and stiffen upon cooling down, so as to become more rigid and robust in the cooled down state. Hence, particularly reliable protection of the devices during subsequent processing of the wafer, such as grinding and/or polishing, can be ensured.

The protective film of the protective sheeting may have a thickness in the range of 5 to 200 µm, preferably 8 to 100 µm, more preferably 10 to 80 µm and even more preferably 12 to 50 µm. Particularly preferably, the protective film of the protective sheeting has a thickness in the range of 80 to 150 µm. In this way, it can be ensured that the protective film is flexible and pliable enough to sufficiently conform to the contours of the device area and, at the same time, exhibits a sufficient thickness in order to reliably and efficiently protect the devices formed in the device area.

The protective sheeting of the invention may further comprise a base sheet attached to the back surface of the cushioning layer. In this case, the back surface of the protective sheeting may be constituted by a back surface of the base sheet.

A front surface of the base sheet opposite to the back surface thereof may be in direct contact with the back surface of the cushioning layer.

The material of the base sheet is not particularly limited.

The base sheet may be made of a soft or pliable material, such as, for example, a polymer material, e.g., polyvinyl chloride (PVC) or ethylene vinyl acetate (EVA).

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, and more preferably up to a temperature of 250° C. or more.

The base sheet may have a thickness in the range of 30 to 1500 µm, preferably 40 to 1200 µm and more preferably 50 to 1000 µm. Particularly preferably, the base sheet has a thickness in the range of 30 to 250 µm. A thickness of the base sheet of 50 µm is especially preferred. For example, the base sheet may be a polyethylene terephthalate (PET) film with a thickness of 50 µm.

The protective sheeting may have a thickness, excluding the thickness of the base sheet if present, in the range of 30 to 800 µm, preferably 50 to 700 µm, more preferably 80 to 600 µm and even more preferably 100 to 500 µm.

The invention further provides, according to a second aspect, a protective sheeting for use in processing a wafer. The protective sheeting comprises a protective film and a cushioning layer attached to a back surface of the protective film. The protective sheeting is configured so that, on an entire front surface and on an entire back surface of the protective sheeting, no adhesive is applied.

The entire front surface and the entire back surface of the protective sheeting are thus devoid of an adhesive.

The protective sheeting is configured to be used in processing a wafer, having on one side, i.e., the front side, a device area with a plurality of devices. The protective sheeting can be used for processing a wafer substantially in the same manner as detailed above.

The protective sheeting of the second aspect provides substantially the same technical effects and advantages as detailed above for the first aspect. In particular, any possible contamination of or damage to the devices formed in the device area, e.g., due to an adhesive force of an adhesive layer or adhesive residues on the devices, can be eliminated.

The protective sheeting thus enables reliable and efficient processing of a wafer and allows for any risk of contamination and damage to the wafer, in particular, to the devices formed in the device area, to be minimised.

The wafer may have the properties, characteristics and features described in detail above.

The size and the shape of the wafer are not particularly limited. The wafer may be a semiconductor-sized wafer or a wafer with a different size and/or shape.

In a top view thereon, the wafer may have, for example, a circular shape, an oval shape, an elliptical shape or a polygonal shape, such as a rectangular shape or a square shape.

The protective sheeting may have any type of shape. In a top view thereon, the protective sheeting may have, for example, a circular shape, an oval shape, an elliptical shape or a polygonal shape, such as a rectangular shape or a square shape.

The protective sheeting may have substantially the same shape or the same shape as the wafer.

The protective sheeting may have substantially the same shape or the same shape as the device area of the wafer. For example, the protective sheeting may have an outer diameter which is substantially the same as an outer diameter of the device area, and the protective sheeting may have substantially the same shape or the same shape as the device area of the wafer.

The wafer may have, on the front side thereof, a peripheral marginal area having no devices and being formed around the device area.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The protective film may have the properties, characteristics and features described in detail above.

The cushioning layer may have the properties, characteristics and features described in detail above.

The protective sheeting may further comprise a base sheet, as described in detail above.

The protective sheeting may have an outer diameter which is larger than an outer diameter of the wafer.

The protective sheeting may have an outer diameter which is smaller than the outer diameter of the wafer.

The protective sheeting may have an outer diameter which is substantially the same as the outer diameter of the wafer.

The protective sheeting may have an outer diameter which is substantially the same as an outer diameter of the device area.

The protective film and/or the cushioning layer may have an outer diameter which is larger than an outer diameter of the wafer.

The protective film and/or the cushioning layer may have an outer diameter which is smaller than the outer diameter of the wafer.

The protective film and/or the cushioning layer may have an outer diameter which is substantially the same as the outer diameter of the wafer.

The protective film and/or the cushioning layer may have an outer diameter which is substantially the same as an outer diameter of the device area.

The invention further provides, according to a third aspect, a handling system for a semiconductor-sized wafer, comprising a semiconductor-sized annular frame and the protective sheeting of the first aspect. The protective sheeting is attached to the annular frame through the substantially annular adhesive layer so that a central opening of the annular frame is closed by the protective sheeting.

The semiconductor-sized wafer, the semiconductor-sized annular frame and the protective sheeting of the first aspect have been described in detail above.

In particular, as has been detailed above, the substantially annular adhesive layer may be a continuous adhesive layer. Alternatively, the substantially annular adhesive layer may be a discontinuous adhesive layer. In particular, in the substantially annular adhesive layer, the adhesive may be provided in a discontinuous form, such as a dotted form, a stripe form, e.g., with straight and/or curved stripes, or the like.

The invention further provides, according to a fourth aspect, a combination comprising a semiconductor-sized wafer, having on one side a device area with a plurality of devices, and the protective sheeting of the first aspect. The protective sheeting is attached to the one side of the semiconductor-sized wafer, so that the semiconductor-sized wafer is arranged in the central area of the protective sheeting and a front surface of the protective film opposite to the back surface thereof is in direct contact with the one side of the semiconductor-sized wafer.

The semiconductor-sized wafer and the protective sheeting of the first aspect have been described in detail above.

The invention further provides, according to a fifth aspect, a combination comprising a wafer, having on one side a device area with a plurality of devices, and the protective sheeting of the second aspect. The protective sheeting is attached to the one side of the wafer, so that a front surface of the protective film opposite to the back surface thereof is in direct contact with the one side of the wafer.

The wafer and the protective sheeting of the second aspect have been described in detail above.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to protective sheetings for use in processing a wafer W, to handling systems for the wafer W and to combinations of the wafer W and the protective sheetings.

Figure 1:
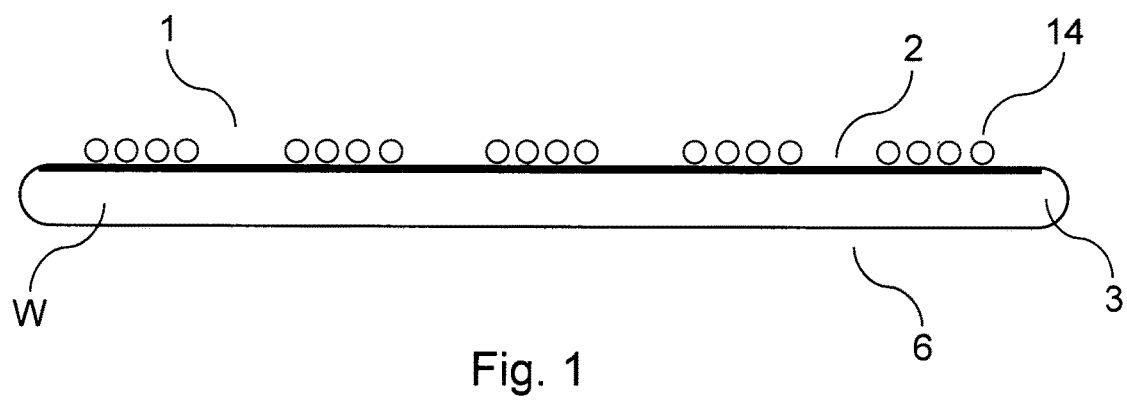
FIG. 1 is a cross-sectional view showing a wafer to be processed using the protective sheeting of the present invention.

The wafer W can be, for example, a MEMS wafer having MEMS devices formed on the surface of a front side 1 thereof (see FIG. 1). However, the wafer W is not limited to a MEMS wafer, but may also be a CMOS wafer having CMOS devices, preferably as solid-state imaging devices, formed on the front side 1 thereof or a wafer with other types of devices on the front side 1.

The wafer W may be made of a semiconductor, e.g., silicon. Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. However, the shape of the wafer W is not particularly limited. In other embodiments, the wafer W may have, for example, an oval shape, an elliptical shape or a polygonal shape, such as a rectangular shape or a square shape.

The wafer W is provided with a plurality of crossing division lines 11 (see FIG. 4), called streets, formed on the front side 1 thereof, thereby partitioning the wafer W into a plurality of rectangular regions where devices 7, such as those described previously, are respectively formed. These devices 7 are formed in a device area 2 of the wafer W. In the case of a circular wafer W, this device area 2 is preferably circular and arranged concentrically with the outer circumference of the wafer W.

Figure 3:
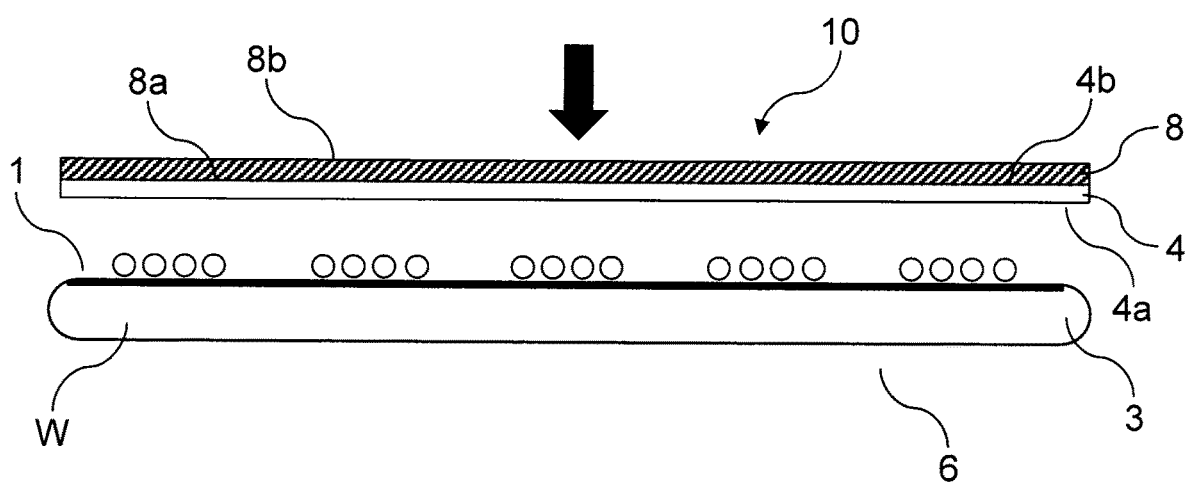
FIG. 3 is a cross-sectional view illustrating a step of applying the protective sheeting according to the first embodiment shown in FIG. 2 to the wafer shown in FIG. 1.
Figure 4:
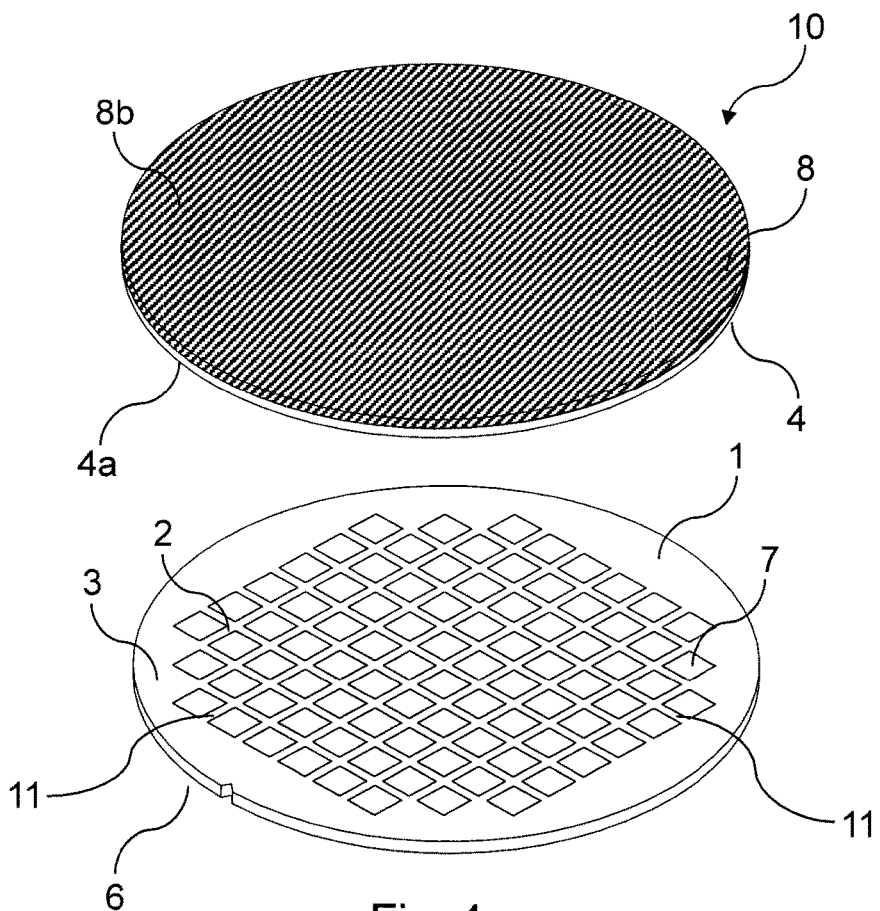
FIG. 4 is a perspective view illustrating the step of applying the protective sheeting according to the first embodiment to the wafer.

In the present embodiment, the device area 2 is surrounded by an annular peripheral marginal area 3, as is schematically shown in FIGS. 1, 3 and 4. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The device area 2 is formed with a plurality of protrusions 14 protruding from a plane surface of the wafer W, as is schematically shown, for example, in FIGS. 1 and 3. The protrusions 14 may be, for example, bumps for establishing an electrical contact with the devices 7 of the device area 2 in the separated chips or dies. The height of the protrusions 14 in the thickness direction of the wafer W may be in the range of 20 to 500 μm.

In the following, a protective sheeting 10 according to a first embodiment of the present invention will be described with reference to FIGS. 1 to 5.

Figure 2:
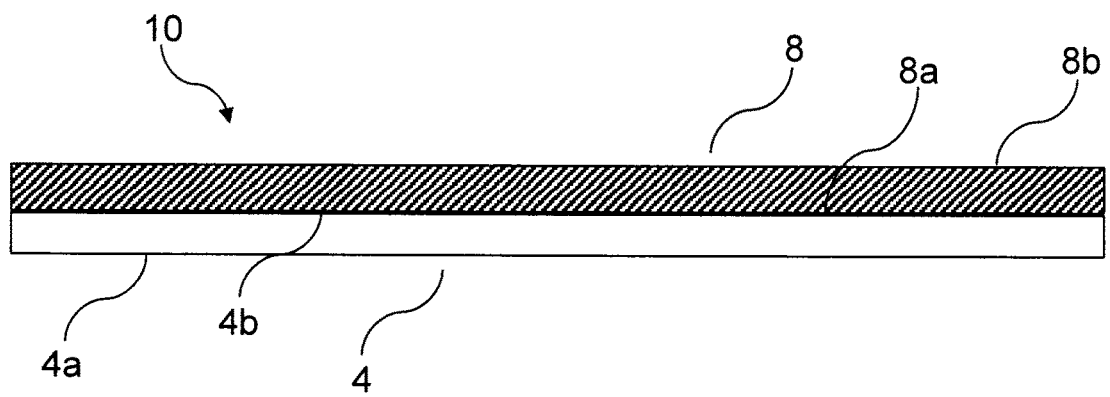
FIG. 2 is a cross-sectional view showing a protective sheeting according to a first embodiment of the present invention.
Figure 5:
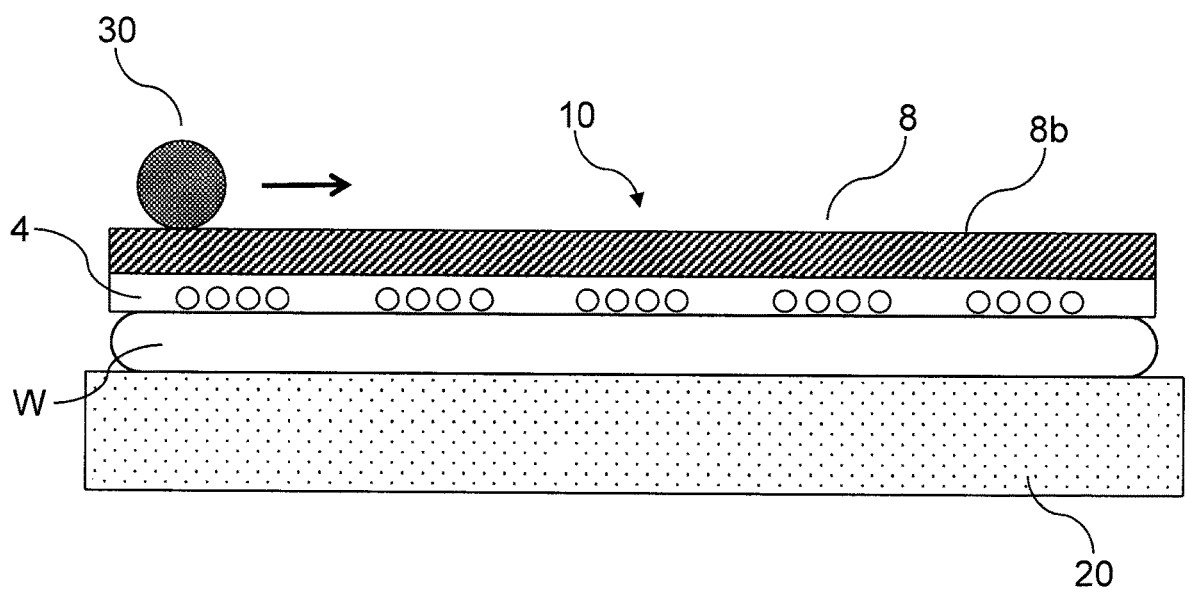
FIG. 5 is a cross-sectional view illustrating a step of attaching the protective sheeting according to the first embodiment to the wafer.

FIG. 1 shows a cross-sectional view of the wafer W to be processed using the protective sheeting 10 according to the first embodiment of the present invention. FIG. 2 shows a cross-sectional view of the protective sheeting 10 according to the first embodiment. FIGS. 3 and 4 illustrate a step of applying the protective sheeting 10 to the wafer W. FIG. 5 illustrates a step of attaching the protective sheeting 10 to the wafer W.

The protective sheeting 10 comprises a protective film 4 and a cushioning layer 8 attached to a back surface 4b of the protective film 4 (see FIG. 2). A front surface 8a of the cushioning layer 8 is in direct contact with the back surface 4b of the protective film 4. The protective sheeting 10 is configured so that, on an entire front surface 4a of the protective film 4, which constitutes the front surface of the protective sheeting 10, and on an entire back surface 8b of the cushioning layer 8, which constitutes the back surface of the protective sheeting 10, no adhesive is applied. The front surface 4a of the protective film 4 and the back surface 8b of the cushioning layer 8 are thus devoid of an adhesive.

The protective sheeting 10 substantially has the same shape as the wafer W, i.e., a circular shape in the present embodiment, and is concentrically attached thereto (see FIGS. 3 to 5). The diameter of the protective sheeting 10 is approximately the same as that of the wafer W, as is schematically shown in FIGS. 4 and 5.

The protective film 4 is made of a polyolefin. For example, the protective film 4 may be made of polyethylene (PE) or polypropylene (PP). The protective film 4 may have a thickness in the range of 5 to 200 μm, preferably 80 to 150 μm. For example, the protective film 4 may have a thickness of 80 μm.

The cushioning layer 8 may be formed of a resin, an adhesive, a gel or the like. The cushioning layer 8 may have a thickness in the range of 20 to 500 µm.

The cushioning layer 8 may be curable by an external stimulus, such as UV radiation, heat, an electric field and/or a chemical agent. In this case, the cushioning layer 8 hardens at least to some degree upon application of the external stimulus thereto. For example, the cushioning layer 8 may be formed of a curable resin, a curable adhesive, a curable gel or the like.

Preferred examples of UV curable resins for use as the cushioning layer 8 in the present embodiment are ResiFlat by the DISCO Corporation and TEMPLOC by DENKA.

The protective sheeting 10 is configured to cover the devices 7 formed in the device area 2, including the protrusions 14, thus protecting the devices 7 against damage or contamination (see FIGS. 4 and 5). Further, the protective sheeting 10 acts as a cushion in subsequent processing of the wafer W, e.g., in a subsequent grinding step, as will be detailed below.

The protective sheeting 10, for covering the devices 7 on the wafer W, is applied to the front side 1 of the wafer W, as is indicated by an arrow in FIG. 3. Specifically, the protective sheeting 10 is applied to the front side 1 of the wafer W so that the front surface 4a of the protective film 4 is in direct contact with the wafer front side 1. Thus, no material, in particular, no adhesive, is present between the front surface 4a of the protective film 4 and the front side 1 of the wafer W (see FIGS. 3 to 5).

After applying the protective sheeting 10 to the front side 1 of the wafer W, the protective film 4 is heated, so that the protective film 4, and thus the entire protective sheeting 10, is attached to the wafer front side 1.

In particular, the wafer W with the protective sheeting 10 applied thereto may be placed on a chuck table 20 (see FIG. 5) and the chuck table 20 may be heated, e.g., to a temperature in the range of 60° C. to 150° C. Particularly preferably, the chuck table 20 is heated to a temperature of approximately 100° C. The chuck table 20 may be heated, for example, over a duration in the range of 1 min to 10 min.

Further, pressure is applied to the back surface of the protective sheeting 10, i.e., the back surface 8b of the cushioning layer 8, by means of a roller 30, as is shown in FIG. 5. The roller 30 is moved along the back surface 8b of the cushioning layer 8, as is indicated by an arrow in FIG. 5, pressing the protective sheeting 10 against the front side 1 of the wafer W.

The roller 30 may be a heated roller. In addition to heating the protective film 4 through the heated chuck table 20, or as an alternative thereto, heat may be applied to the protective film 4 by the heated roller 30 through the cushioning layer 8.

Alternatively or additionally, pressure may be applied to the back surface 8b of the cushioning layer 8 by using two parallel pressing plates, as will be detailed below for the third embodiment with reference to FIG. 8.

By heating the protective film 4, using the heated chuck table 20 and/or the heated roller 30, the protective sheeting 10 is attached to the front side 1 of the wafer W.

Specifically, an attachment force between protective film 4 and wafer W, holding the protective sheeting 10 in its position on the wafer W, is generated through the heating process. In particular, by heating the protective film 4, a form fit and/or a material bond is formed between protective film 4 and wafer W.

By applying pressure to the back surface 8b of the cushioning layer 8, the front surface 4a of the protective film 4 is pressed against the front side 1 of the wafer W. Thus, it can be particularly efficiently ensured that the protective sheeting 10 is reliably attached to the wafer W.

In the attached state of the protective sheeting 10, the protrusions 14 protruding from the plane surface of the wafer W are fully embedded in the protective sheeting 10, as is schematically shown in FIG. 5.

The wafer W and the protective sheeting 10 attached thereto form a combination according to an embodiment of the present invention.

If the cushioning layer 8 is curable by an external stimulus, the external stimulus may be applied to the cushioning layer 8 so as to cure the cushioning layer 8, after applying the protective sheeting 10 to the front side 1 of the wafer W. The external stimulus may be applied to the cushioning layer 8 after attaching the protective sheeting 10 to the wafer front side 1.

The external stimulus may be applied to the cushioning layer 8 before processing, e.g., grinding, a wafer back side 6. In this way, the protection of the wafer W during processing and the processing accuracy can be further improved.

After attaching the protective sheeting 10 to the front side 1 of the wafer W, the back side 6 of the wafer W (see FIGS. 1, 3 and 4), being opposite to the front side 1 thereof, is processed. The back side 6 of the wafer W may be processed by grinding and/or polishing and/or etching and/or cutting. Particularly preferably, the back side 6 of the wafer W is processed by grinding.

In particular, the wafer W, having the protective sheeting 10 attached thereto, may be removed from the chuck table 20 and turned around, so that the wafer back side 6 faces upward. Subsequently, processing of the wafer back side 6, e.g., by grinding, may be performed. Such a grinding step is detailed below for the third embodiment of the protective sheeting of the present invention with reference to FIG. 11.

During processing, such as grinding, the back side 6 of the wafer W, the wafer W can be placed on a support (not shown), such as a chuck table, so that the back surface 8b of the cushioning layer 8 is in contact with an upper surface of the support. The protective sheeting 10 reliably protects the wafer W, in particular, the devices 7 and the protrusions 14, from any damage during wafer processing.

After the back side 6 of the wafer W has been ground, the wafer W may be cut along the division lines 11 so as to obtain individual chips or dies (not shown).

For example, the protective sheeting 10 may be removed, e.g., peeled off, from the wafer W after grinding the back side 6 thereof. This removal process may be facilitated, for example, by heating the protective film 4 before and/or during removing it from the wafer W.

Subsequently, the wafer W may be cut along the division lines 11 from the front side 1 thereof. In this way, chips or dies which are fully separated from each other are obtained. Cutting the wafer W may be performed by mechanical cutting, e.g., using a blade or a saw, and/or cutting by laser and/or cutting by plasma.

In particular, cutting by laser may be performed, for example, by ablation laser cutting and/or by stealth laser cutting, i.e., by forming modified areas within the wafer W by the application of a laser beam, and/or by forming a plurality of hole regions in the wafer W by the application of a laser beam. Each of these hole regions may be composed of a modified region and a space in the modified region open to a surface of the wafer W.

After the chips or dies have been completely separated from one another in the cutting step, they can be picked up, e.g., by using a pick-up device (not shown). The spacing between the individual chips or dies can be increased prior to the pick-up process, in order to facilitate the pick-up process.

In the following, a protective sheeting 110 according to a second embodiment of the present invention will be described with reference to FIGS. 6 and 7.

The protective sheeting 110 according to the second embodiment differs from the protective sheeting 10 according to the first embodiment in that the diameter of the protective sheeting 110 is larger than the outer diameter of the wafer W and in that a substantially annular adhesive layer 42 is applied to an outer peripheral portion of the front surface 4a of the protective film 4. In the description of the second embodiment, the elements which are substantially identical to those of the first embodiment are denoted by the same reference signs and a repeated detailed description thereof is omitted.

The substantially annular adhesive layer 42 may be a continuous adhesive layer. Alternatively, the substantially annular adhesive layer 42 may be a discontinuous adhesive layer. In particular, in the substantially annular adhesive layer 42, the adhesive may be provided in a discontinuous form, such as a dotted form, a stripe form, e.g., with straight and/or curved stripes, or the like.

Figure 6:
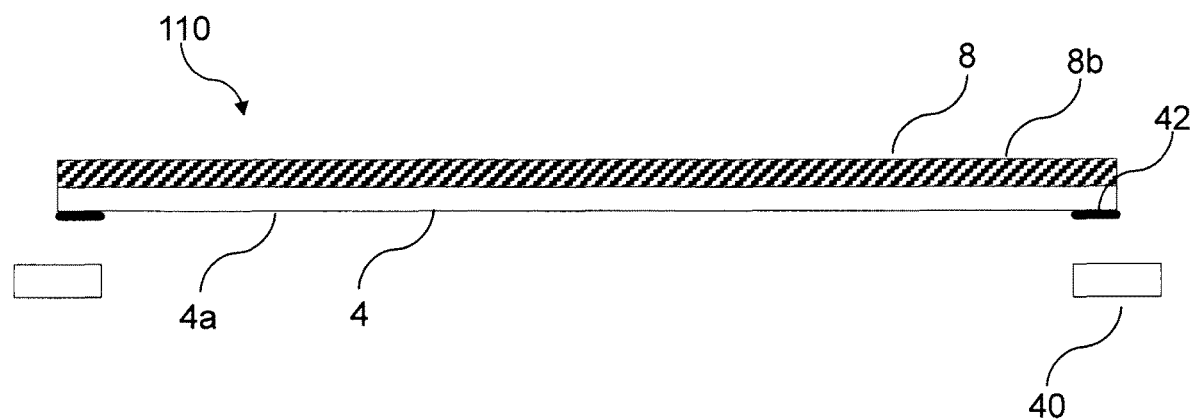
FIG. 6 is a cross-sectional view showing a protective sheeting according to a second embodiment of the present invention and an annular frame.

FIG. 6 shows the protective sheeting 110 and an annular frame 40 prior to the attachment of the protective sheeting 110 to the annular frame 40. In the present embodiment, the wafer W is a semiconductor-sized wafer and the annular frame 40 is a semiconductor-sized annular frame.

Figure 7:
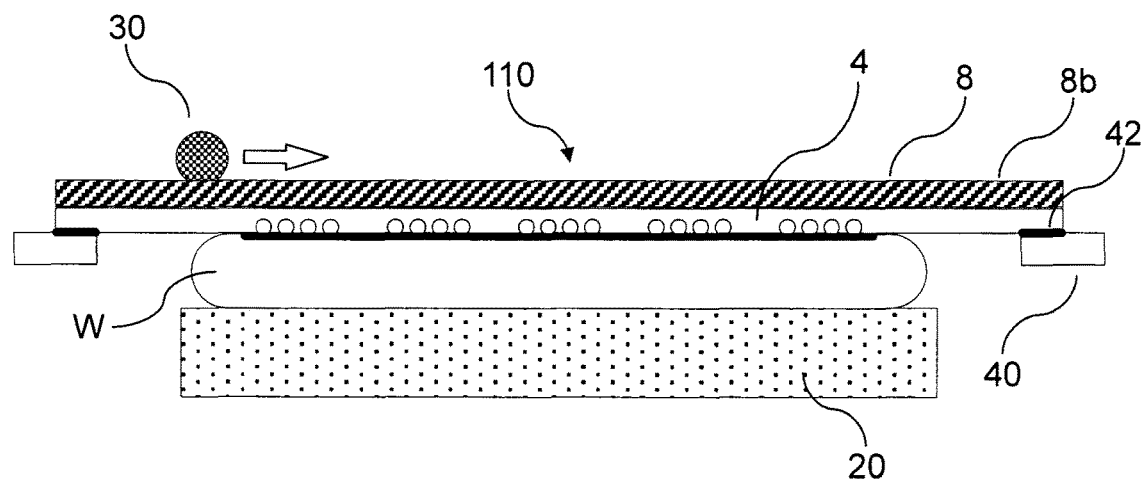
FIG. 7 is a cross-sectional view illustrating a step of attaching the protective sheeting according to the second embodiment shown in FIG. 6 to the wafer shown in FIG. 1.

When using the protective sheeting 110 according to the second embodiment in processing the wafer W, an outer peripheral portion of the protective sheeting 110 is attached to the annular frame 40 through the substantially annular adhesive layer 42 (see FIG. 7). The adhesive layer 42 is arranged between the protective film 4 and the annular frame 40. The attached state of the protective sheeting 110 and the annular frame 40 is illustrated in FIG. 7.

In particular, the outer peripheral portion of the protective sheeting 110 is attached to the annular frame 40 so that the protective sheeting 110 closes a central opening of the annular frame 40. The annular frame 40 and the protective sheeting 110 attached thereto form a handling system according to an embodiment of the present invention.

The substantially annular adhesive layer 42 is configured so that an inner diameter thereof is substantially equal to an inner diameter of the semiconductor-sized annular frame 40 (see FIG. 7). In a central area of the protective sheeting 110, no adhesive is applied to the front surface of the protective sheeting 110, i.e., the front surface 4a of the protective film 4. The central area of the protective sheeting 110 has an outer diameter which is larger than an outer diameter of the semiconductor-sized wafer W, as is shown in FIG. 7. Further, no adhesive is applied to the back surface of the protective sheeting 110, i.e., the back surface 8b of the cushioning layer 8. Hence, the entire back surface of the protective sheeting 110 is devoid of an adhesive.

The protective sheeting 110 is applied to the front side 1 of the wafer W, so that the wafer W is arranged in the central area of the protective sheeting 110 and the front surface 4a of the protective film 4 is in direct contact with the wafer front side 1 (see FIG. 7). Thus, no material, in particular, no adhesive, is present between the front surface 4a of the protective film 4 and the front side 1 of the wafer W.

In the present embodiment, the step of attaching the outer peripheral portion of the protective film 4 to the annular frame 40 is preferably performed before applying the protective sheeting 110 to the wafer W. In this way, the step of applying the protective sheeting 110 to the wafer W can be further facilitated, e.g., using the annular frame 40 for handling and transporting the wafer W.

After applying the protective sheeting 110 to the wafer W, heat and pressure are applied to the protective sheeting 110 in the same manner as detailed above for the first embodiment with reference to FIG. 5, thereby attaching the protective sheeting 110 to the wafer W (see FIG. 7).

The wafer W and the protective sheeting 110 attached thereto constitute a combination according to an embodiment of the present invention.

As has been detailed above, the wafer W, which is attached to the protective sheeting 110, in particular, to the central area thereof, is held by the annular frame 40 through the protective sheeting 110. Thus, a wafer unit, comprising the wafer W, the protective sheeting 110 and the annular frame 40, is formed, facilitating processing, handling and/or transport of the wafer W (see FIG. 7).

After attaching the protective sheeting 110 to the wafer W, the wafer W may be processed substantially in the same manner as detailed above for the first embodiment.

In the following, a protective sheeting 210 according to a third embodiment of the present invention will be described with reference to FIGS. 8 to 14.

Figure 8:
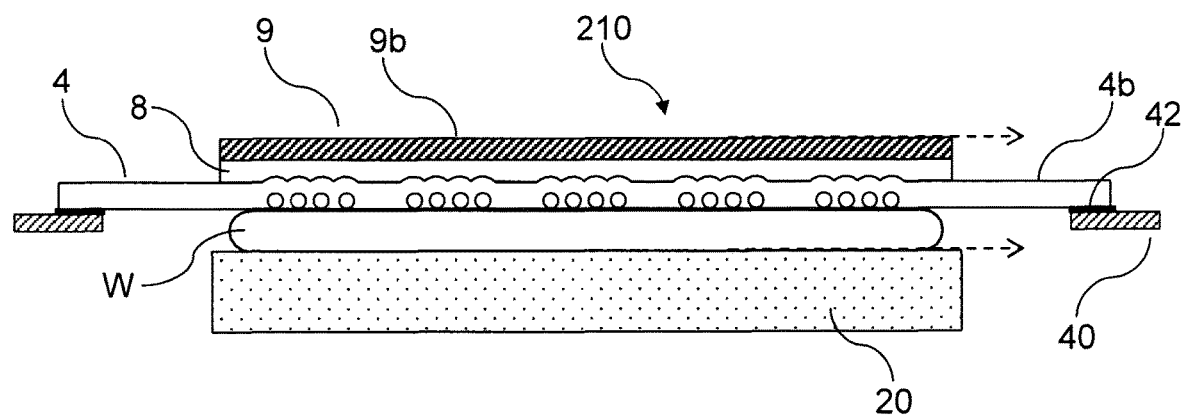
FIG. 8 is a cross-sectional view showing a protective sheeting according to a third embodiment of the present invention in a state in which it is attached to the wafer shown in FIG. 1.

The protective sheeting 210 according to the third embodiment differs from the protective sheeting 110 according to the second embodiment in that the cushioning layer 8 has a smaller diameter than the protective film 4 and in that a base sheet 9 is provided on the back surface 8b of the cushioning layer 8 (see, for example, FIG. 8). In the description of the third embodiment, the elements which are substantially identical to those of the previous embodiments are denoted by the same reference signs and a repeated detailed description thereof is omitted.

FIG. 8 shows the protective sheeting 210 according to the third embodiment in a state in which it is attached to the semiconductor-sized wafer W. As is indicated in FIG. 8, the wafer topography originating from the protrusions 14 is not fully absorbed by the protective film 4. Thus, a surface unevenness is generated on the back surface 4b of the protective film 4. Such a surface unevenness may occur for the case of protrusions 14 with relatively large heights. However, this surface unevenness of the protective film 4 is absorbed by the cushioning layer 8, so that the protrusions 14 are fully embedded in the protective film 4 and the cushioning layer 8.

The base sheet 9 is attached to the back surface 8b of the cushioning layer 8, so that a front surface of the base sheet 9 is in direct contact with the back surface 8b of the cushioning layer 8. In the present embodiment, a back surface 9b of the base sheet 9 forms the back surface of the protective sheeting 210.

The material of the base sheet 9 is not particularly limited.

The base sheet 9 may be made of a soft or pliable material, such as, for example, a polymer material, e.g., polyvinyl chloride (PVC) or ethylene vinyl acetate (EVA).

Alternatively, the base sheet 9 may be made of a rigid or hard material, such as polyethylene terephthalate (PET) and/or silicon and/or glass and/or stainless steel (SUS).

For example, if the base sheet 9 is made of polyethylene terephthalate (PET) or glass and the cushioning layer 8 is curable by an external stimulus, the cushioning layer 8 may be cured with radiation that is transmittable through polyethylene terephthalate (PET) or glass, for instance UV radiation. If the base sheet 9 is made of silicon or stainless steel (SUS), a cost-efficient base sheet 9 is provided.

Also, the base sheet 9 may be formed of a combination of the materials listed above.

The base sheet 9 may have a thickness in the range of 30 to 1500 µm, preferably 40 to 1200 µm and more preferably 50 to 1000 µm. Particularly preferably, the base sheet 9 has a thickness in the range of 30 to 250 µm. A thickness of the base sheet 9 of 50 µm is especially preferred. For example, the base sheet 9 may be a polyethylene terephthalate (PET) film with a thickness of 50 µm.

The base sheet 9 and the cushioning layer 8 each have a substantially circular shape. The diameters of the base sheet 9 and the cushioning layer 8 are substantially identical to each other and larger than the diameter of the semiconductor-sized wafer W. The diameters of the base sheet 9 and the cushioning layer 8 are smaller than the diameter of the protective film 4.

The protective sheeting 210 thus comprises the base sheet 9, the cushioning layer 8 and the protective film 4. In a central area of the protective sheeting 210, no adhesive is applied to the front surface of the protective sheeting 210, i.e., the front surface 4a of the protective film 4, in substantially the same manner as detailed above for the second embodiment. The central area of the protective sheeting 210 has an outer diameter which is larger than an outer diameter of the semiconductor-sized wafer W, as is shown in FIG. 8. Further, no adhesive is applied to the back surface of the protective sheeting 110, i.e., the back surface 9b of the base sheet 9. Hence, the entire back surface of the protective sheeting 110 is devoid of an adhesive.

The annular frame 40 and the protective sheeting 210 attached thereto form a handling system according to an embodiment of the present invention (see FIG. 8).

The protective sheeting 210 is applied to the front side 1 of the wafer W, so that the wafer W is arranged in the central area of the protective sheeting 210 and the front surface 4a of the protective film 4 is in direct contact with the wafer front side 1 (see FIG. 8). Hence, no material, in particular, no adhesive, is present between the front surface 4a of the protective film 4 and the front side 1 of the wafer W.

Subsequently, the protective film 4 is heated so as to attach the protective sheeting 210 to the front side 1 of the wafer W. The protective film 4 may be heated substantially in the same manner as detailed above for the first embodiment, i.e., by means of the heated chuck table 20 (see FIG. 8).

Further, in the present embodiment, pressure is applied to the back surface 9b of the base sheet 9 by using two parallel pressing plates. In the pressure application process, one plate presses against the back surface 9b of the base sheet 9 and the other plate presses against the back side 6 of the wafer W. In this way, it can be ensured that the back surface 9b of the base sheet 9 is substantially parallel to the wafer back side 6, as is indicated by dashed arrows in FIG. 8.

The pressing plates may be heated pressing plates, allowing for the protective film 4 to be heated during the pressing process through the wafer W and/or through the base sheet 9 and the cushioning layer 8. This heating process may be performed in addition or as an alternative to heating the protective film 4 by means of the heated chuck table 20.

The wafer W and the protective sheeting 210 attached thereto form a combination according to an embodiment of the present invention.

If the cushioning layer 8 is curable by an external stimulus, the external stimulus may be applied to the cushioning layer 8 substantially in the same manner as detailed above for the first embodiment.

Figure 9:
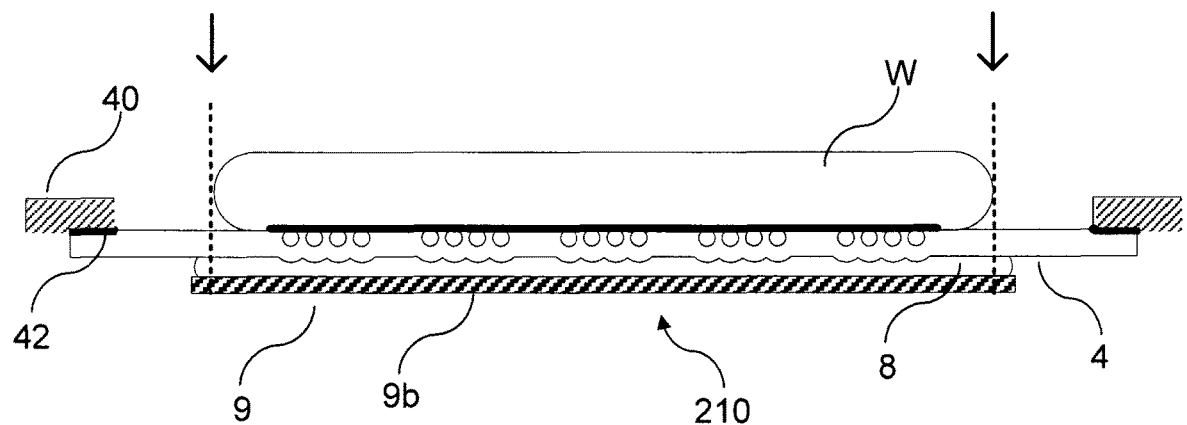
FIG. 9 is a cross-sectional view illustrating a step of cutting off a portion of the protective sheeting according to the third embodiment.

FIG. 9 illustrates a subsequent step of cutting off portions of the protective film 4, the cushioning layer 8 and the base sheet 9 which laterally extend beyond the circumference of the wafer W, as is indicated by dashed lines and arrows in FIG. 9. These portions may be cut off, for example, by mechanical cutting, e.g., using a blade or a saw, laser cutting or plasma cutting. Cutting off these portions facilitates handling of the wafer unit in subsequent processing steps.

Figure 10:
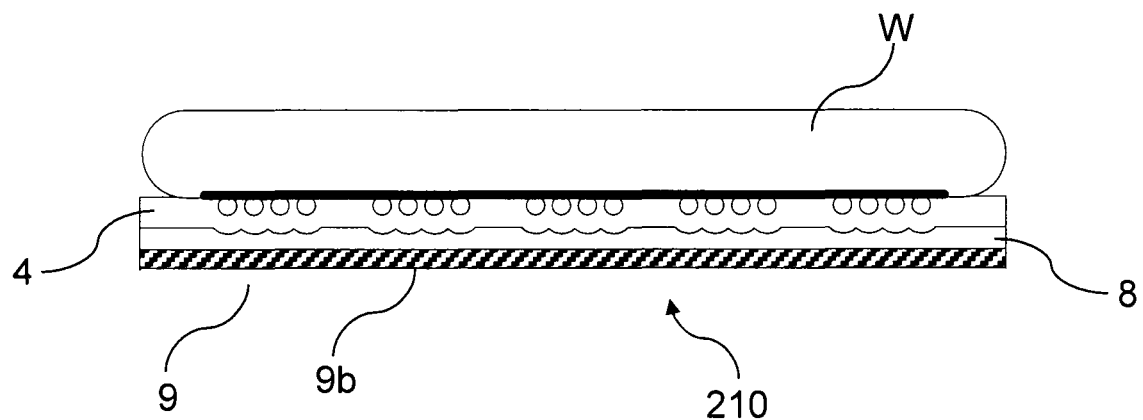
FIG. 10 is a cross-sectional view showing the outcome of the step of cutting off a portion of the protective sheeting illustrated in FIG. 9.

FIG. 10 shows the outcome of the cutting step illustrated in FIG. 9.

After this cutting step, the back side 6 of the wafer W is processed, i.e., subjected to a grinding process, as will be detailed in the following.

Figure 11:
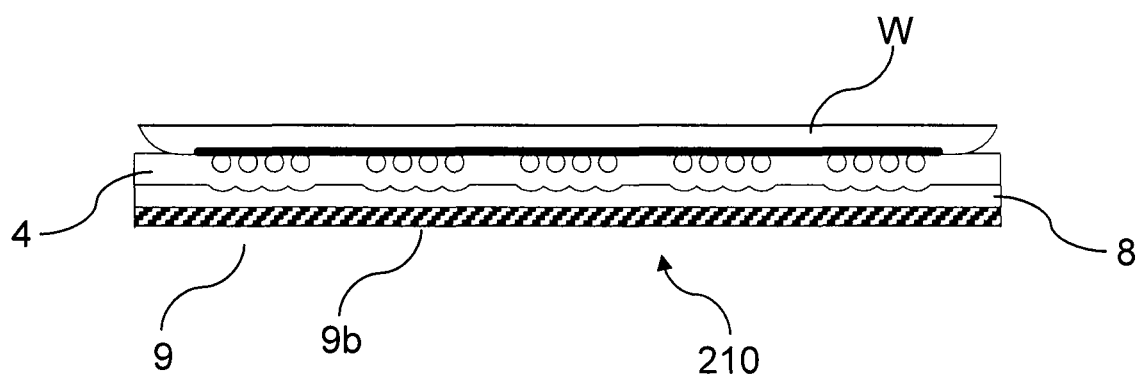
FIG. 11 is a cross-sectional view showing the outcome of a step of grinding the wafer back side after cutting off a portion of the protective sheeting according to the third embodiment.

The back surface 9b of the base sheet 9, which is a plane, flat surface, is placed on the top surface of a chuck table (not shown) which may be identical to the chuck table 20 in FIG. 8. Subsequently, the back side 6 of the wafer W is ground for adjusting the wafer thickness, e.g., to a value in the range of approximately 20 to 100 µm. The thickness can be the final thickness of the chips or dies. FIG. 11 shows the outcome of this grinding step.

The grinding of the back side 6 of the wafer W may be performed using a grinding apparatus (not shown). The grinding apparatus may comprise a spindle housing, a spindle rotatably accommodated in the spindle housing and a grinding wheel mounted to the lower end of the spindle. A plurality of abrasive members may be fixed to the lower surface of the grinding wheel, wherein each abrasive member may be formed from a diamond abrasive member configured by fixing diamond abrasive grains with a bond, such as a metal bond or a resin bond. The grinding wheel having the abrasive members is rotated at high speeds by driving the spindle, e.g., using a motor.

In the grinding step, the chuck table holding the wafer unit and the grinding wheel of the grinding apparatus are rotated and the grinding wheel is lowered so as to bring the abrasive members of the grinding wheel into contact with the back side 6 of the wafer W, thereby grinding the back side 6.

Since the plane back surface 9b of the base sheet 9, which is placed on the top surface of the chuck table of the grinding apparatus, is substantially parallel to the back side 6 of the wafer W (see FIG. 8), the pressure applied to the wafer W by the grinding wheel during the grinding process is evenly and homogenously distributed over the wafer W. Hence, any risk of a pattern transfer or breakage of the wafer W can be minimised. Further, the substantially parallel alignment of the flat, even back surface 9b of the base sheet 9 and the back side 6 of the wafer W allows for the grinding step to be carried out with a high degree of precision, thus achieving a particularly uniform and homogenous wafer thickness after grinding.

The further processing of the wafer W, i.e., the cutting thereof and the picking up of the separated chips or dies, may be performed substantially in the same manner as detailed above for the first embodiment.

In the following, a modification of the process illustrated in FIGS. 9 to 11 will be described with reference to FIGS. 12 to 14.

Figure 12:
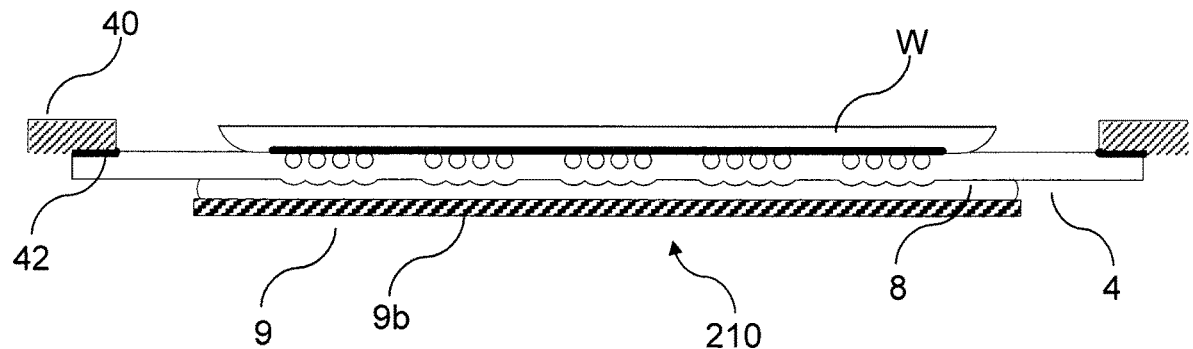
FIG. 12 is a cross-sectional view showing the outcome of a step of grinding the wafer back side before cutting off a portion of the protective sheeting according to the third embodiment.
Figure 13:
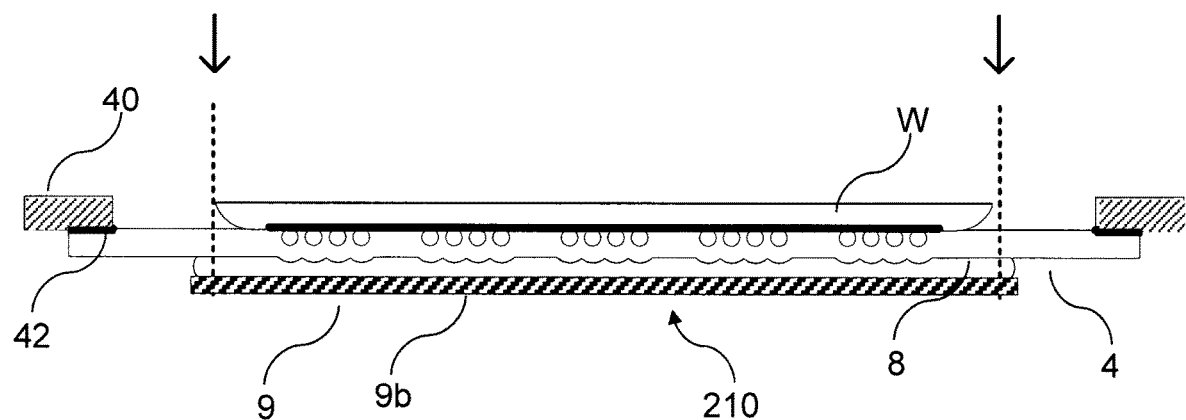
FIG. 13 is a cross-sectional view illustrating a step of cutting off a portion of the protective sheeting according to the third embodiment after grinding the wafer back side.
Figure 14:
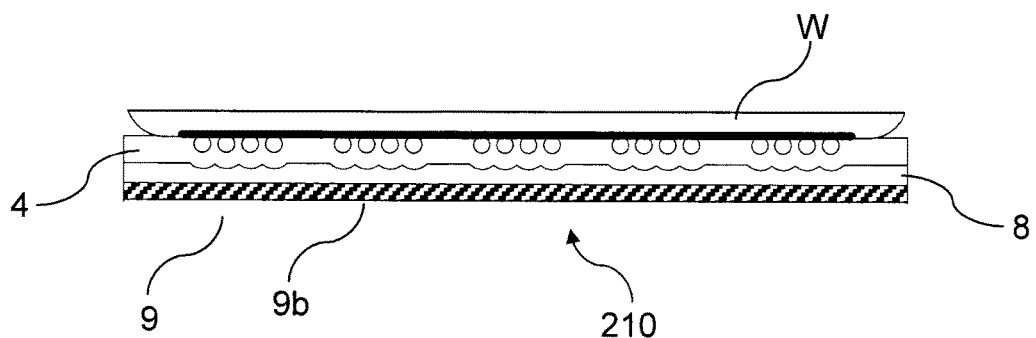
FIG. 14 is a cross-sectional view showing the outcome of the step of cutting off a portion of the protective sheeting illustrated in FIG. 13.

The method illustrated in FIGS. 12 to 14 differs from the method illustrated in FIGS. 9 to 11 in the order of the steps of cutting the protective sheeting 210 and grinding the wafer back side 6.

In particular, in the method illustrated in FIGS. 12 to 14, the back side 6 of the wafer W is ground first, while the protective sheeting 210 is still attached to the annular frame 40. The outcome of this grinding step is shown in FIG. 12.

The wafer back side 6 is ground substantially in the same manner as detailed above with reference to FIG. 11.

Subsequently, portions of the protective film 4, the cushioning layer 8 and the base sheet 9 which laterally extend beyond the circumference of the wafer W are cut off, as is indicated by dashed lines and arrows in FIG. 13. This cutting step is carried out substantially in the same manner as detailed above with reference to FIG. 9. FIG. 14 shows the outcome of the cutting step illustrated in FIG. 13.

The further processing of the wafer W, i.e., the cutting thereof and the picking up of the separated chips or dies, may be performed substantially in the same manner as detailed above for the first embodiment.

In the following, a protective sheeting 310 according to a fourth embodiment of the present invention will be described with reference to FIG. 15.

The protective sheeting 310 according to the fourth embodiment differs from the protective sheeting 10 according to the first embodiment in that the base sheet 9 is attached to the back surface 8*b* of the cushioning layer 8 (see, for example, FIG. 6). In the description of the fourth embodiment, the elements which are substantially identical to those of the previous embodiments are denoted by the same reference signs and a repeated detailed description thereof is omitted.

Figure 15:
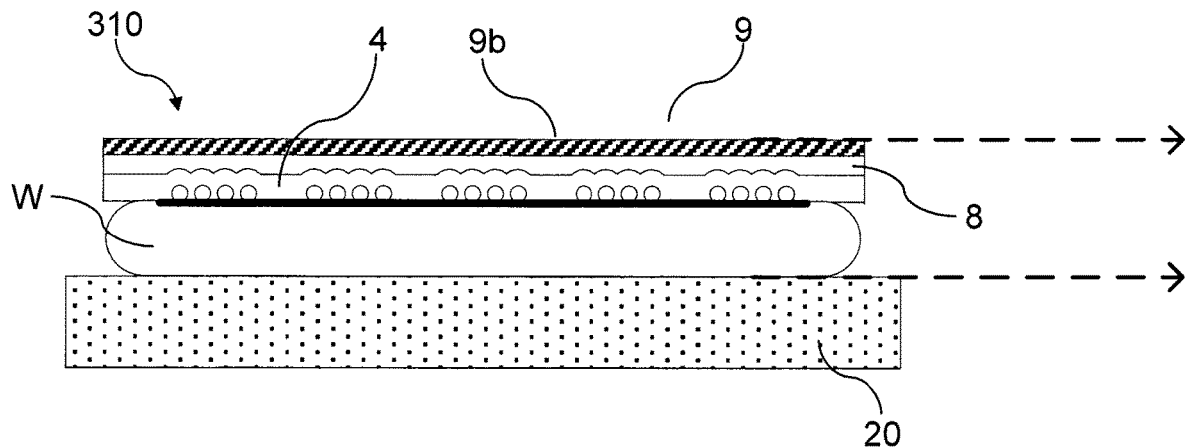
FIG. 15 is a cross-sectional view showing a protective sheeting according to a fourth embodiment of the present invention in a state in which it is attached to the wafer shown in FIG. 1.

The base sheet 9 is attached to the back surface 8*b* of the cushioning layer 8 so that the front surface of the base sheet 9 is in direct contact with the back surface 8*b* of the cushioning layer 8 (see FIG. 15). The base sheet 9 may have the same properties and characteristics as detailed above for the third embodiment.

The diameters of the protective film 4, the cushioning layer 8 and the base sheet 9 are substantially identical to each other and identical to the diameter of the wafer W (see FIG. 15).

The protective film 4, the cushioning layer 8 and the base sheet 9 may be attached to the wafer front side 1 substantially in the same manner as detailed above for the third embodiment.

The outcome of this attachment process is shown in FIG. 15. The back surface 9*b* of the base sheet 9 is substantially parallel to the back side 6 of the wafer W, as is indicated by dashed arrows in FIG. 15.

Subsequently, the back side 6 of the wafer W is ground substantially in the same manner as detailed above for the third embodiment.

The further processing of the wafer W, i.e., the cutting thereof and the picking up of the separated chips or dies, may be performed substantially in the same manner as detailed above for the first embodiment.

In the following, a protective sheeting 410 according to a fifth embodiment of the present invention will be described with reference to FIGS. 16 and 17.

The protective sheeting 410 according to the fifth embodiment differs from the protective sheeting 310 according to the fourth embodiment in that the protective film 4 has a smaller diameter than the cushioning layer 8 and the cushioning layer 8 reaches over the protective film 4. In the description of the fifth embodiment, the elements which are substantially identical to those of the previous embodiments are denoted by the same reference signs and a repeated detailed description thereof is omitted.

Figure 16:
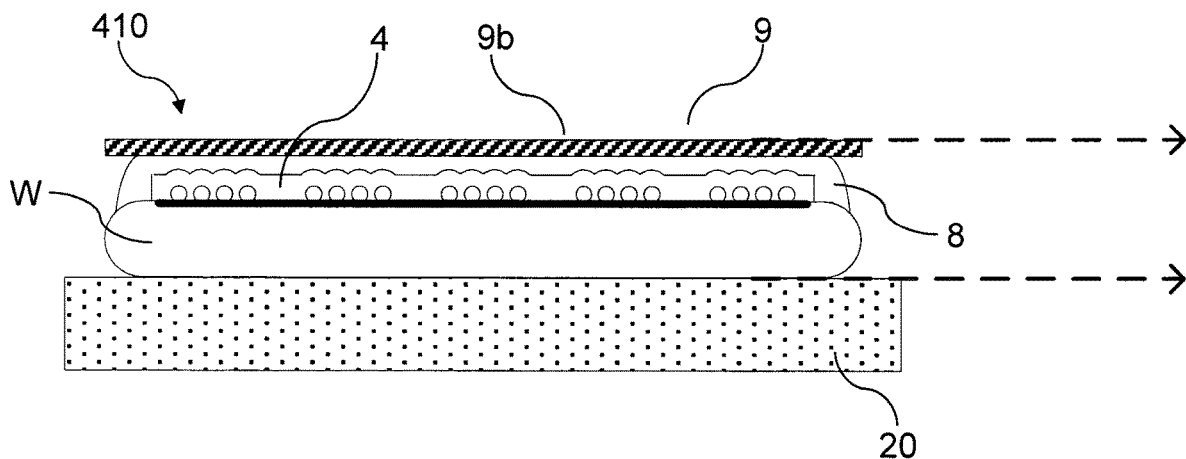
FIG. 16 is a cross-sectional view showing a protective sheeting according to a fifth embodiment of the present invention in a state in which it is attached to the wafer shown in FIG. 1.
Figure 17:
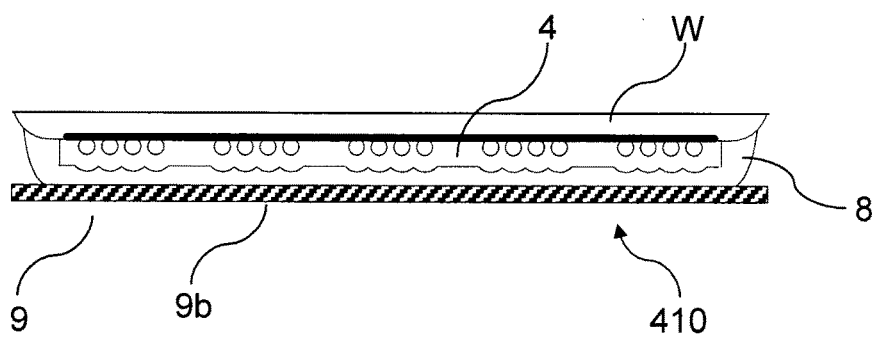
FIG. 17 is a cross-sectional view showing the outcome of a step of grinding the back side of the wafer to the front side of which the protective sheeting according to the fifth embodiment is attached.

Specifically, the protective film 4 has a diameter which is substantially the same as the diameter of the device area 2 of the wafer W (see FIGS. 16 and 17).

The protective sheeting 410 may be attached to the wafer front side 1 substantially in the same manner as detailed above for the third embodiment. The outcome of this attachment process is shown in FIG. 16.

As is illustrated in this figure, the cushioning layer 8 surrounds an outer circumference of the protective film 4 and is in direct contact with the wafer front side 1. This arrangement provides an especially stable and robust attachment of the protective sheeting 410, in particular, the protective film 4, to the wafer front side 1. The strength of this attachment may be further enhanced by curing the cushioning layer 8.

Subsequently, the back side 6 of the wafer W is ground substantially in the same manner as detailed above for the third embodiment. The outcome of this grinding process is shown in FIG. 17.

The further processing of the wafer W, i.e., the cutting thereof and the picking up of the separated chips or dies, may be performed substantially in the same manner as detailed above for the first embodiment.

The invention claimed is:

1. A protective sheeting for use in processing a semiconductor-sized wafer, the protective sheeting comprising:
   a protective film; and
   a cushioning layer attached to a back surface of the protective film, the cushioning layer being curable by an external stimulus so that the cushioning layer hardens at least to some degree upon application of the external stimulus,
   wherein, at least in a central area of the protective sheeting, no adhesive is applied to a front surface and a back surface of the protective sheeting, the central area having an outer diameter which is equal to or larger than an outer diameter of the semiconductor-sized wafer, and
   the front surface of the protective sheeting is exposed or exposable to the outside and the back surface of the protective sheeting is exposed or exposable to the outside,
   wherein the protective sheeting is configured to be attachable to the wafer by attaching the protective film to the wafer so that a front surface of the protective film opposite to the back surface thereof is in direct contact with the wafer, and
   wherein the protective sheeting is configured so that the entire protective sheeting, comprising the protective film and the cushioning layer, is removable from the wafer in a non-destructive manner.

2. The protective sheeting according to claim 1, wherein the outer diameter of the central area is in the range of 3 to 50 cm.

3. The protective sheeting according to claim 1, wherein, on the entire front surface and/or the entire back surface of the protective sheeting, no adhesive is applied.

4. The protective sheeting according to claim 1, wherein a substantially annular adhesive layer is applied to an outer peripheral portion of a front surface of the protective film opposite to the back surface thereof.

5. The protective sheeting according to claim 4, wherein an inner diameter of the substantially annular adhesive layer is substantially equal to or larger than an inner diameter of a semiconductor-sized annular frame for holding the semiconductor-sized wafer.

6. A handling system for a semiconductor-sized wafer, comprising
   a semiconductor-sized annular frame; and
   the protective sheeting according to claim 4, wherein the protective sheeting is attached to the annular frame through the substantially annular adhesive layer so that a central opening of the annular frame is closed by the protective sheeting.

7. The protective sheeting according to claim 1, wherein the cushioning layer is curable by an external stimulus, such as UV radiation, heat, an electric field and/or a chemical agent.

8. The protective sheeting according to claim 1, wherein the cushioning layer has a thickness in the range of 20 to 500 µm.

9. The protective sheeting according to claim 1, wherein the protective film has a thickness in the range of 5 to 200 µm.

10. The protective sheeting according to claim 1, wherein the protective film is made of a polymer, in particular, a polyolefin.

11. A protective sheeting for use in processing a wafer, the protective sheeting comprising:
a protective film; and
a cushioning layer attached to a back surface of the protective film, the cushioning layer being curable by an external stimulus so that the cushioning layer hardens at least to some degree upon application of the external stimulus,
wherein, on an entire front surface and an entire back surface of the protective sheeting, no adhesive is applied, and
the front surface of the protective sheeting is exposed or exposable to the outside and the back surface of the protective sheeting is exposed or exposable to the outside,
wherein the protective sheeting is configured to be attachable to the wafer by attaching the protective film to the wafer so that a front surface of the protective film opposite to the back surface thereof is in direct contact with the wafer, and
wherein the protective sheeting is configured so that the entire protective sheeting, comprising the protective film and the cushioning layer, is removable from the wafer in a non-destructive manner.

12. A combination comprising
a semiconductor-sized wafer, having on one side a device area with a plurality of devices; and
a protective sheeting, the protective sheeting including:
a protective film; and
a cushioning layer attached to a back surface of the protective film, the cushioning layer being curable by an external stimulus so that the cushioning layer hardens at least to some degree upon application of the external stimulus,
wherein, at least in a central area of the protective sheeting, no adhesive is applied to a front surface and a back surface of the protective sheeting, the central area having an outer diameter which is equal to or larger than an outer diameter of the semiconductor-sized wafer, and
the front surface of the protective sheeting is exposed or exposable to the outside and the back surface of the protective sheeting is exposed or exposable to the outside,
wherein the protective sheeting is configured to be attachable to the wafer, and
wherein the protective sheeting is configured to be removable from the wafer in a non-destructive manner,
wherein the protective sheeting is attached to the one side of the semiconductor-sized wafer, so that the semiconductor-sized wafer is arranged in the central area of the protective sheeting and a front surface of the protective film opposite to the back surface thereof is in direct contact with the one side of the semiconductor-sized wafer.

13. A combination comprising
a wafer, having on one side a device area with a plurality of devices; and
a protective sheeting, the protective sheeting including:
a protective film; and
a cushioning layer attached to a back surface of the protective film, the cushioning layer being curable by an external stimulus so that the cushioning layer hardens at least to some degree upon application of the external stimulus,
wherein, on an entire front surface and an entire back surface of the protective sheeting, no adhesive is applied, and
the front surface of the protective sheeting is exposed or exposable to the outside and the back surface of the protective sheeting is exposed or exposable to the outside,
wherein the protective sheeting is configured to be attachable to the wafer, and wherein the protective sheeting is configured to be removable from the wafer in a non-destructive manner,
wherein the protective sheeting is attached to the one side of the wafer, so that a front surface of the protective film opposite to the back surface thereof is in direct contact with the one side of the wafer.

14. A protective sheeting for use in processing a semiconductor-sized wafer, the protective sheeting comprising:
a protective film; and
a cushioning layer attached to a back surface of the protective film, the cushioning layer being curable by an external stimulus so that the cushioning layer hardens at least to some degree upon application of the external stimulus,
wherein, at least in a central area of the protective sheeting, no adhesive is applied to a front surface and a back surface of the protective sheeting, the central area having an outer diameter which is equal to or larger than an outer diameter of the semiconductor-sized wafer, and
a substantially annular adhesive layer is applied to an outer peripheral portion of a front surface of the protective film opposite to the back surface thereof.

15. The protective sheeting according to claim 14, wherein an inner diameter of the substantially annular adhesive layer is substantially equal to or larger than an inner diameter of a semiconductor-sized annular frame for holding the semiconductor-sized wafer.

16. A handling system for a semiconductor-sized wafer, comprising
a semiconductor-sized annular frame; and
the protective sheeting according to claim 14,
wherein the protective sheeting is attached to the annular frame through the substantially annular adhesive layer so that a central opening of the annular frame is closed by the protective sheeting.

* * * * *